United States Patent
Menolfi et al.

(10) Patent No.: US 7,724,862 B2
(45) Date of Patent: May 25, 2010

(54) PHASE LOCKED LOOP APPARATUS WITH ADJUSTABLE PHASE SHIFT

(75) Inventors: Christian Ivo Menolfi, Zurich (CH); Thomas Helmut Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/140,535

(22) Filed: Jun. 17, 2008

(65) Prior Publication Data

US 2008/0292040 A1   Nov. 27, 2008

Related U.S. Application Data

(63) Continuation of application No. 11/216,952, filed on Aug. 31, 2005, now Pat. No. 7,492,850.

(51) Int. Cl.
    *H03L 7/06* (2006.01)
(52) U.S. Cl. .................. 375/376; 375/355; 375/362; 375/371; 375/373; 375/374; 375/375; 327/141; 327/147; 327/148; 327/149; 327/150; 327/155; 327/158; 327/159; 327/162; 327/163; 455/264; 455/208; 455/260
(58) Field of Classification Search .......... 327/141, 327/147, 148, 149, 150, 155, 156, 158, 159, 327/162, 163; 375/355, 362, 371, 373, 374, 375/375, 376; 455/264, 208, 260
See application file for complete search history.

(56) References Cited

U.S. PATENT DOCUMENTS

| | | | | |
|---|---|---|---|---|
| 5,334,951 A * | 8/1994 | Hogeboom | 331/1 A |
| 5,373,257 A * | 12/1994 | Shimoda | 331/8 |
| 5,550,515 A * | 8/1996 | Liang et al. | 331/11 |
| 6,868,134 B2 * | 3/2005 | Yoshizaki | 375/354 |
| 7,019,677 B1 * | 3/2006 | Soman et al. | 341/144 |
| 7,138,841 B1 * | 11/2006 | Li et al. | 327/175 |
| 7,379,520 B2 * | 5/2008 | Chen | 375/371 |
| 7,443,941 B2 * | 10/2008 | Farjad-rad | 375/373 |
| 7,492,850 B2 * | 2/2009 | Menolfi et al. | 375/376 |
| 2003/0117200 A1 * | 6/2003 | Koh et al. | 327/238 |
| 2004/0257163 A1 * | 12/2004 | Farooqui | 331/25 |
| 2005/0069052 A1 * | 3/2005 | Carbonari | 375/316 |
| 2008/0309329 A1 * | 12/2008 | Kahlman et al. | 324/228 |

* cited by examiner

*Primary Examiner*—Chieh M Fan
*Assistant Examiner*—Siu M Lee
(74) *Attorney, Agent, or Firm*—Tutunjian & Bitetto, P.C.; Brian Verminski, Esq.

(57) ABSTRACT

The phase locked loop (PLL) with adjustable phase shift is described. The PLL includes a voltage controlled oscillator which is capable of generating multiple phase shifted output signals, and multiple phase detectors capable of determining the phase differences between the output signals and a reference clock. The PLL further includes a weighting device capable of weighting the phase differences and generating a control signal for the voltage controlled oscillator.

13 Claims, 6 Drawing Sheets

PHASE LOCKED LOOP APPARATUS WITH ADJUSTABLE PHASE SHIFT

RELATED APPLICATION INFORMATION

This application is a Continuation of U.S. patent application Ser. No. 11/216,952 filed. Aug. 31, 2005 now U.S. Pat. No. 7,492,850 incorporated herein by reference in its entirety.

TECHNICAL FIELD

The present invention relates to a phase locked loop with adjustable phase shift and the use of the phase locked loop in clock and data recovery systems.

BACKGROUND OF THE INVENTION

Figure 1:
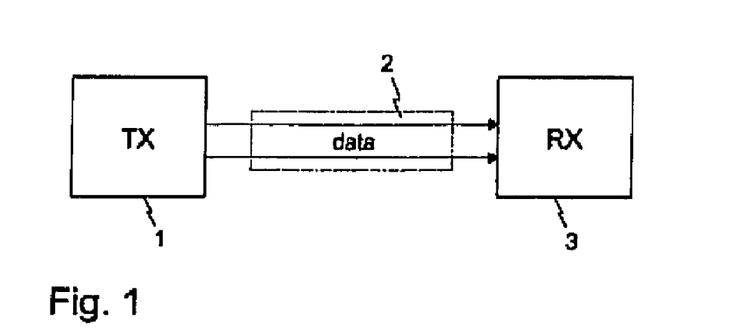

High-speed serial links are used to transmit data from chip to chip over wired media, such as a printed circuit board or a backplane. The general link model is displayed in FIG. 1. A transmitter 1 sends data over a data channel 2, which is then received by a receiver 3. Transmitter/and receiver 3 are integrated on-chip. The data channel 2 can be a combination of printed circuit board, connectors, backplane wiring and cable. In general, the receiver 3 has to perform clock recovery to account for variations in the symbol timing.

The aggregate data rates in future chip to chip communication will soon reach several Tbits/s in some applications. Since serial links are analog in nature, ordinary scaling in power and area, as seen for digital logic, does not apply. Hence, the relative area and power consumption of the chip input/output interface versus logic is increasing. On the receiver side, most power is spent for clock generation. In consequence, it is a challenge to find a serial link receiver architecture which minimizes area and power consumption.

In high-speed links, sub-rate receiver architectures are frequently used. This allows clocking the receiver at an integer fraction 1/S of the data rate, thereby relaxing the requirements on the sampling latches and the clock distribution circuitry. Thus, sub-rate receivers allow exploring the speed limits of a given technology and reducing the power consumption.

Figure 2:
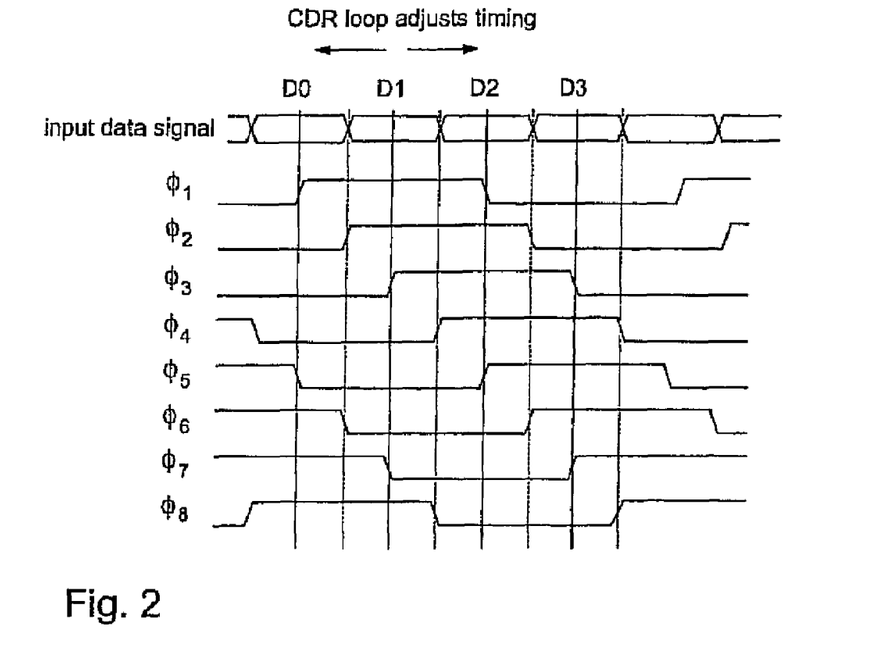

Typical values for S range between 2 and 8. FIG. 2 displays the required sample clocks for a quarter rate (S=4) receiver, where four data bits D0 to D3 are sampled in one clock cycle. In order to extract also the timing information the incoming data signal has to be over-sampled, with an over-sampling factor M typically being either 2 or 3, wherein in FIG. 2 M=2. Hence, the clock generator has to supply a total number of S×M equidistantly spaced clock phases, i.e. a quarter rate receiver with an over-sampling factor M=2 generates S×M=8 clock phases $\phi_1$ to $\phi_8$ as depicted in FIG. 2. Additionally, means have to be provided to shift these clocks $\phi_1$ to $\phi_8$ in phase by some controlled amount in order to align the clocks $\phi_1$ to $\phi_8$ to the phase of the incoming data signal. This phase shift should not be limited to a finite phase range in order to allow plesiochronous operation. A plesiochronous operation describes an operation that is almost, but not quite, in synchronization—in other words, almost synchronous.

In a dual loop architecture for clock and data recovery (CDR), which is described in S. Sidiropoulos, M. Horowitz, "A Semi-Digital Dual Delay-Locked Loop," IEEE J. Solid-State Circuits, vol. 32, no. 11, pp. 1683-1692, November 1997, the clock phases are generated from a clean local reference clock. A second loop, functioning as a digital delay locked loop, then locks the sampling phases to the random input data.

Figure 3:
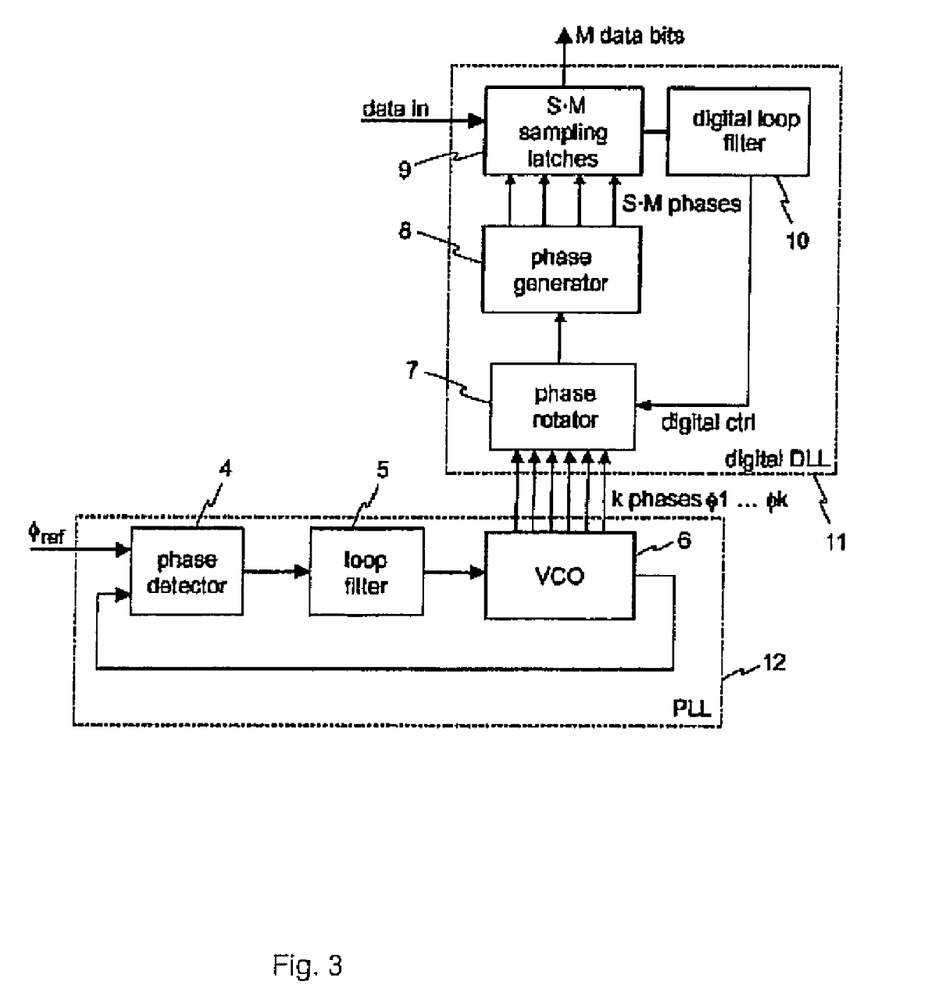

In J. Kim, M. Horowitz, "Adaptive Supply Serial Links with Sub-1-V Operation and Per-Pin Clock Recovery", IEEE J. Solid-State Circuits, Vol. 37, No. 11, pp. 1403-1413, November 2002, a sub-rate dual-loop clock and data recovery circuit is described. In FIG. 3 the CDR circuit for S=4 and an over-sampling factor M=2 is shown. A reference clock $\phi_{ref}$ enters a phase-locked loop (PLL) 12, which then generates at its output a number of k clock phases $\phi_1$ to $\phi_k$. These clock phases $\phi_1$ to $\phi_k$ are then fed to a phase rotator 7, which allows setting the phase by some digital value, wherein the digital value is given by a digital control signal ctrl. The clock coming out of the phase rotator 7 enters a phase generator 8, which provides S×M=8 equidistantly spaced clocks to be used in S×M=8 sampling latches 9. The resulting samples (four data bits, and four edge bits) then enter a digital loop filter 10, which finally controls the phase rotator 7. This forms a digital delay locked loop (DLL) 11, which tracks the phase and small frequency deviations of the input data.

In the embodiment according to FIG. 3, the phase shift is achieved by inserting the phase rotator 7 in the digital DLL 11. The phase rotator 7, however, increases the loop delay, suffers from non-linearity, and requires careful control of the signal slew rates.

The circuit described in K.-L. Wong et al., "A 27-mW 3.6 Gb/s I/O Transceiver," IEEE J. Solid-State Circuits, vol. 39, no. 4, pp. 602-612, April 2004, achieves a simultaneous shift in the clock phases by introducing a programmable imbalance in the charge pump currents. This has the disadvantage of limiting the adjustable delay range to some unit intervals, which disallows plesiochronous operation.

SUMMARY OF THE INVENTION

An object of the invention is to provide a phase locked loop with adjustable phase shift, wherein the phase shift is not limited to a finite phase range.

Advantageously, the phase locked loop with adjustable phase shift is able to be used in a plesiochronous operation mode.

A further object is to provide a phase locked loop with adjustable phase shift, wherein its chip area and power consumption are minimized.

According to one aspect of the invention, the object is achieved by a phase locked loop with adjustable phase shift with the features of the independent claim 1.

The phase locked loop with adjustable phase shift according to the invention comprises a voltage controlled oscillator to generate multiple phase shifted output signals. The phase locked loop further comprises multiple phase detectors to detect the phase differences between the output signals and a reference clock and a weighting device to weight the phase differences and generating a control signal for the voltage controlled oscillator.

Advantageous further developments of the invention arise from the characteristics indicated in the dependent patent claims.

Preferably, the multiple phase detectors of the phase locked loop according the invention are formed by XOR-gates. With that, space and power saving phase detectors can be build up easily.

The multiple phase detectors of the phase locked loop according to the invention can formed by Gilbert multipliers. This is a further possibility to build up phase detectors, which are space and power saving.

In a further embodiment of the phase locked loop according to the invention where two phase detectors which are not simultaneously active have common multiplier elements. Thus, additional chip space can be saved.

In another embodiment of the phase locked loop according to the invention the voltage controlled oscillator comprises a multi stage delay line to generate the phase shifted output signals.

The phase locked loop according to the invention can comprise a voltage-to-current converter disposed between the weighting device and the voltage controlled oscillator.

The phase locked loop according to the invention can also comprise a loop filter disposed between the voltage-to-current converter and the voltage controlled oscillator.

Furthermore, the weighting device of the phase locked loop according to the invention can comprise multiple digital-analog converters to receive a digital control value and generate therefrom analog weighting factors for weighting the phase differences.

According to a further embodiment of the invention the digital-analog converters of the phase locked loop are binary and thermometer encoded. The thermometer encoding architecture ensures high linearity. The combination of binary and thermometer encoding is a good tradeoff between high linearity and chip space saving.

The phase locked loop according to the invention preferably comprises a switching unit to connect one of the two phase detectors which have common multiplier elements to one of the digital-analog converters. This additionally helps saving chip space.

In a further embodiment, the phase locked loop according to the invention is a part of a clock and data recovery system. The clock and data recovery system furthermore comprises multiple sampling latches, which are capable of intermediately storing received data, and which are connected to the voltage controlled oscillator.

Finally, the phase locked loop according to the invention can be used in a receiver of a serial data link.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

FIG. 1 a block diagram of the basic principle of a serial data link comprising a transmitter and a receiver, FIG. 2 a timing diagram with the sample clocks for sampling an incoming data signal, FIG. 3 a block diagram of a receiver according to the prior art, FIG. 4 a block diagram of an embodiment of a multi receiver system having a clock and data recovery unit according to the invention, FIG. 5 a more detailed block diagram of a phase locked loop with adjustable phase shift according to the invention, FIG. 6 the design of a multi-phase phase detector and a weighting unit, which are usable for the PLL with adjustable phase shift according to the invention, FIG. 7 a timing diagram of the output signal of one of the slave phase detectors, FIG. 8 a timing diagram of the output currents of two active slave phase detectors, FIG. 9 a block diagram of the voltage controlled oscillator and a full-swing restoration stage, FIG. 10 the core of the voltage controlled oscillator, FIG. 11 a single voltage controlled oscillator delay stage with feed-forward and cross-coupling, and FIG. 12 a diagram of the measured delay as a function of the programmed delay value and delay step.

DETAILED DESCRIPTION OF THE DRAWINGS

An adjustable phase locked loop PLL 13, also called PLL with adjustable phase shift, according to the invention combines the function of phase generation and phase rotation in one single compact unit. Clock phases $\phi_1$ to $\phi_{S\cdot M}$ are simultaneously adjusted directly in the adjustable PLL 13, which is achieved by using a multi-phase phase detector. The proposed adjustable PLL 13 has several advantages: First, it allows connecting the sampling latches directly to the oscillator. With that, the clock path can be kept short, and noise effects can be minimized. Secondly, since no phase rotators are required the proposed adjustable PLL results in small area and low power consumption. Thirdly, compared to a phase rotator, the phase adjustment according to the invention is inherently linear, which eases the design for low supply voltages.

Figure 4:
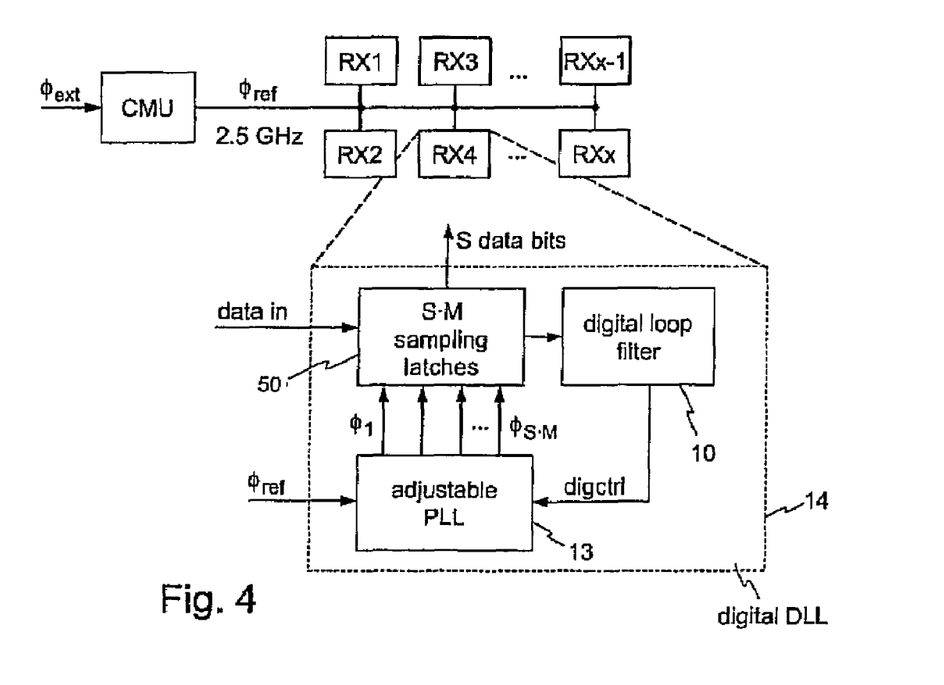

An embodiment of a multi-channel receiver system for an input data rate of, e.g. 10 Gbit/s, using the adjustable PLL 13 according to the invention is shown in FIG. 4. A 2.5 GHz differential reference clock $\phi_{ref}$ is distributed to multiple receivers RX1 to RXx. The differential reference clock $\phi_{ref}$ can either stem from an on-chip clock multiplier unit CMU using a high-Q LC oscillator or, in the case of a synchronous link, can be received on a dedicated clock channel.

In the embodiment according to FIG. 4, an external clock $\phi_{ext}$ is multiplied by a shared on-chip LC-PLL, generating the 2.5 GHz reference clock $\phi_{ref}$ with small jitter, wherein the on-chip LC-PLL is a part of the clock multiplier unit CMU. The reference clock $\phi_{ref}$ is buffered and distributed to several receivers RX1, RX2 to RXx using low-jitter differential signaling, wherein a part of the receiver RX4 is depicted in FIG. 4 and described in the following in more detail. The other receivers RX1, RX2, RX3 and RX5 to RXx can be designed in the same way as receiver RX4. Distributing a high-speed clock $\phi_{ref}$ allows to set the PLL loop bandwidth to high values, hence voltage controlled oscillator VCO noise is suppressed to a high degree. A part of the receiver RX4 is the adjustable PLL 13 with an adjustable phase. In the embodiment according to FIG. 4 for example S·M=2·4=8 equidistant sampling phases $\phi_1$ to $\phi_8$ can be generated and fed to S·M=8 sampling latches 50. The adjustable PLL 13 allows that all eight clock phases $\phi_1$ to $\phi_8$ are simultaneously shifted by the same programmed amount without the need for additional phase shifting devices. The amount by which the clock phases $\phi_1$ to $\phi_8$ are simultaneously shifted is provided by a digital control signal digctrl. Hence, clock phase generation and phase rotation is combined in a single compact device, minimizing the clock path to the sampling latches 50.

In the proposed circuit, the phase shift is thus achieved by controlling the delay in the feedback path of the PLL.

Using a relatively high frequency on the reference clock $\phi_{ref}$ obsoletes the need for clock multiplication in the clock and data recovery circuit and thus allows locking the adjustable PLL 13 with high bandwidth, thereby minimizing the effects of thermal and power-supply induced noise in the VCO of the adjustable PLL 13.

Figure 5:
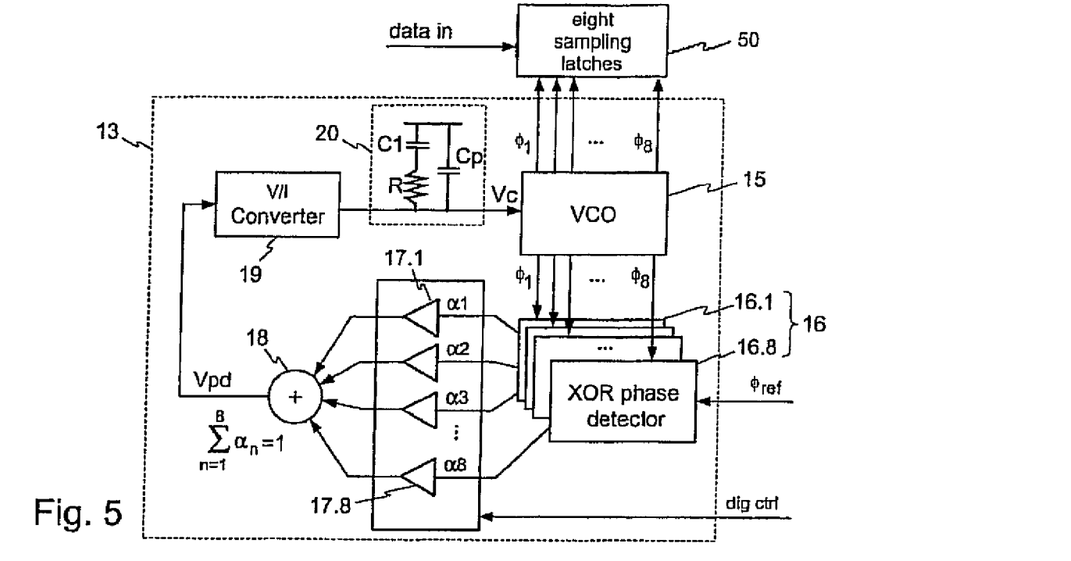

A block diagram of an embodiment of the adjustable PLL 13 is shown in FIG. 5. In this embodiment the VCO 15 produces eight clock phases, also called output signals, $\phi_1$ to $\phi_8$, which are to be used in eight sampling latches 9 of a clock and data recovery circuit. The VCO frequency is regulated by a VCO control voltage Vc stemming from a loop filter 20. The loop filter 20 is a second order low-pass filter with a resistance R, a capacitance Cl and a ripple capacitance Cp.

The eight clock phases $\phi_1$ to $\phi_8$ generated by the VCO 15 are furthermore used by a phase detector 16, which comprises eight slave phase detectors, also known as multiple phase detectors, 16.1 to 16.8. The slave phase detectors 16.1 to 16.8 are of XOR type. Although the minimum number of required slave phase detectors is four, in this implementation, all eight clock phases $\phi_1$ to $\phi_8$ are connected to dedicated phase slave detectors 16.1 to 16.8. This provides a high degree of robustness with respect to duty cycle variations on the reference clock $\phi_{ref}$ and the VCO clocks $\phi_1$ to $\phi_8$.

A coarse phase adjustment can be readily achieved by switching on only one of the eight slave phase detectors 16.1 to 16.8, thereby locking to one of the eight phases $\phi_1$ to $\phi_8$. Hence, the 360° circle is divided into eight coarse phase positions.

A fine adjustment of the phase can be achieved by multiplying the output values of the slave phase-detectors 16.1 to 16.8 by some weighting factors $\alpha_1$ to $\alpha_8$, and by summing the resulting currents. This is depicted in FIG. 5 by the weighting unit 17.1 to 17.8 and the summation unit 18, together known as a weighting device 17.1-17.8, 18. At each time, two adjacent slave phase detectors are active. Hence, it is possible to interpolate between two coarse phase positions by adapting the analog weighting factors $\alpha_1$ to $\alpha_8$.

A voltage Vpd output from the summation unit 18 is converted to a current by a voltage-to-current converter 19, working as a charge-pump.

Generally, the VCO 15 produces S·M clock phases $\phi_1$ to $\phi_{S \cdot M}$, which are fed to S·M sampling latches 9 and additionally to a number N of slave phase detectors. This means that the phase detector 16 comprises N slave phase detectors 16.1 to 16.N, where N is an integer divisor of the number of S·M VCO phases $\phi_1$ to $\phi_{S \cdot M}$. In the embodiment according to FIG. 5 the number of slave phase detectors N=8.

In the following, the slave phase detectors 16.1 to 16.N are also called sub phase detectors or multiple phase detectors.

PLL Modeling and Optimization

The loop dynamics of the adjustable PLL 13 is essentially the same as in the case of a PLL with a single XOR phase detector. In general, the XOR phase detector multiplies the input signals, and the resulting output voltage is fed into a voltage to current converter. In the embodiment of FIG. 5 the slave XOR phase detector 16.1 multiplies the input signal $\phi_1$ and the reference clock $\phi_{ref}$, whereas the slave XOR phase detector 16.2 multiplies the input signal $\phi_2$ and the reference clock $\phi_{ref}$. The same can be applied analogously to the slave XOR phase detectors 16.3 to 16.8. The voltage to current converter 19 is equivalent to a charge pump which steers a current Icp in and out the loop filter 20.

Figure 7:
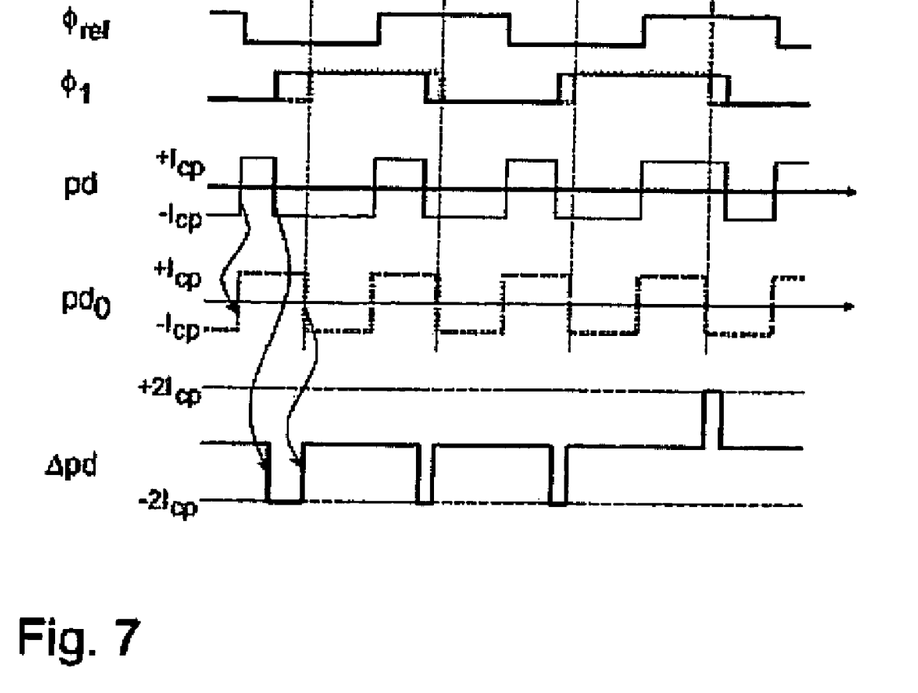
Figure 8:
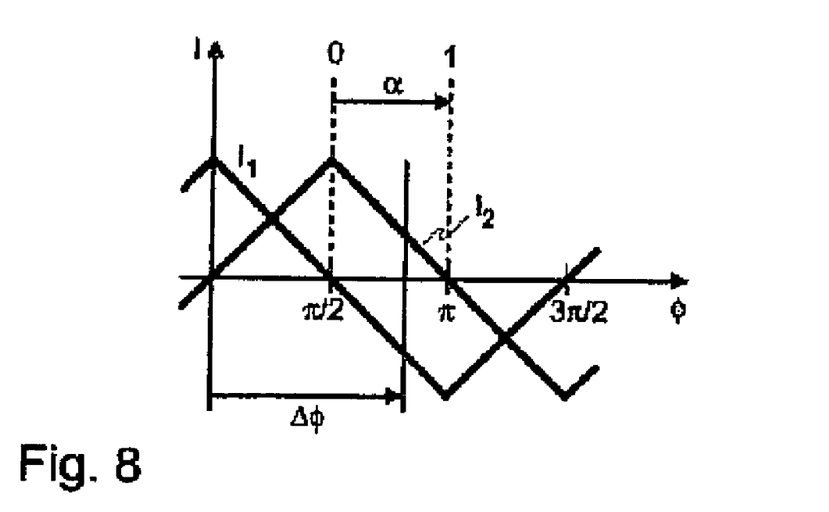

To simplify matters, the model of the adjustable PLL 13 is explained hereinafter by means of the first slave XOR phase detector 16.1. The explanation can be transferred analogously to the remaining slave XOR phase detector 16.2 to 16.8. In order to obtain a correct model of the PLL, it is instructive to separate the output signal pd(t) of the slave XOR phase detector 16.1, which is the result of the XOR-conjunction of the clock $\phi_1$ and the reference clock $\phi_{ref}$ in a cyclic modulation waveform pd0($t$) and a waveform $\Delta$pd(t), which captures the phase deviation of the oscillator clock $\phi_1$, as shown in FIG. 7. The signal $\Delta$pd(t) is also called error information signal. The signal pd0($t$), after being filtered by the loop filter 20, results in a constant ripple on the VCO control voltage Vc. Although causing a cyclic phase modulation, it does not have any influence on the loop dynamics, since it is independent of the actual phase difference.

For an XOR phase detector, the update rate of the error information signal $\Delta$pd is twice the reference frequency $\phi_{ref}$. Hence, the loop dynamics of a charge-pump PLL with an XOR phase detector are equivalent to the case of using two single-edge triggered phase-frequency detectors (PFDs), one for the rising and one for the falling edge. This is due to the fact that in contrast to a PFD, the XOR phase detector measures the phase at both rising and falling edges. As a consequence, the adjustable PLL 13 can be most accurately described by a discrete time model with a sampling frequency of twice the oscillation frequency. Additionally, as can be seen from the $\Delta$pd curve in FIG. 7, the gain $K_{PD}$ of the slave XOR phase detectors 16.1 to 16.8 is given by:

$$K_{PD} = \frac{1}{2\pi} \cdot 2I_{cp} \tag{1}$$

where Icp denotes the charge-pump current.

This is twice the value as for a PFD. Taking into account the special properties of an XOR type charge pump PLL, the second order loop parameters damping factor $\zeta$ and natural frequency $\omega_n$ are thus given by:

$$\zeta = \frac{R}{2} \cdot \sqrt{\frac{2K_{VCO}2I_{cp}C_1}{2\pi}} \tag{2}$$

$$\omega_n = \sqrt{\frac{2K_{VCO}2I_{cp}}{2\pi C_1}} \tag{3}$$

where R and Cl correspond to the components of the loop filter 20 in FIG. 5.

Note that the VCO gain $K_{VCO}$ is also multiplied by two in the equations (2) and (3) since due to the double sampling frequency the phase progresses with double rate.

Effect of Ripple on VCO Control Voltage

The periodic switching activity of the XOR phase detector 16 may cause ripple on the VCO control voltage Vc, resulting in a cyclic phase modulation. By means of appropriate placing the third pole in the loop transfer function ripple can be suppressed.

The square wave current output pd0($t$) of the phase detector 16 is low-pass filtered by the loop filter 20. With a loop filter of second order, ripple can be approximated by a triangular wave with an amplitude $A_{tr}$ given by:

$$A_{tr} = \frac{I_{cp}T_0}{8C_p} \tag{4}$$

with $T_0$ being the inverse of the reference frequency $f_0$, and Cp is the value of the ripple capacitor in the loop filter 20. Since the parasitic higher order poles in the system suppress the higher harmonics of the triangular wave, the ripple voltage at the VCO input can be best described by a sinusoid with amplitude $A_r$:

$$A_r = \frac{\pi I_{cp} T_0}{32 C_p} \quad (5)$$

where the amplitude $A_r$ scales by a factor of $\pi/4$ due to the Fourier series expansion of the triangular waveform. The resulting modulation voltage can thus be approximated by a sinusoid of frequency $2\omega_0$ and amplitude $A_r$. The VCO phase excursion $\Delta\phi(t)$ caused by the ripple voltage is given by:

$$\Delta\phi(t) = A_r K_{VCO} \int_0^t \sin(2\omega_0 t)\, dt \quad (6)$$

resulting in a maximum phase deviation $\Delta\phi_{max}$ of:

$$\Delta\phi_{max} = \frac{A_r K_{VCO}}{2\omega_0} \quad (7)$$

By using the equations (3) and (5) the maximum phase deviation $\Delta\phi_{max}$ calculates to:

$$\Delta\phi_{max} = \frac{\pi^3}{64}\left(\frac{\omega_n}{\omega_0}\right)^2 \frac{C_1}{C_p} \quad (8)$$

where $\omega_0$ is the reference frequency in [rad/s]. Hence, in order to keep $C_1/C_p$ small for stability, small values for the normalized natural frequency $\omega_n/\omega_0$ are preferable.

In order to achieve small jitter and a low third pole (for small ripple) simultaneously, the loop delay should be minimized. The proposed structure is optimal in this sense, since no additional buffers of phase rotators are added to the loop delay.

On the one hand, a PLL is a discrete-time system by nature, since its input variable (phase $\theta_n$) and output variable (phase $\phi_n$) are discrete random variables. On the other hand, the different components of the PLL, e.g. the phase detector, loop filter, and VCO, all operate in the continuous time domain. But on the other hand, the commonly used continuous time approximation for PLLs does not accurately predict the loop dynamics when the loop bandwidth exceeds one tenth of the reference frequency.

In order to accurately model the PLL with a second order loop filter and a loop delay in the feedback path, one can take the approach of simulating the PLL with, e.g. Matlab®, which is a high-level language and interactive environment, and Simulink®, which is a platform for multi domain simulation and model-based design for dynamic systems. Both software tools are provided by MathWorks Inc. The input and output phases are discrete random variables $\theta_n$ and $\phi_n$ with a sampling frequency of twice the reference frequency. For a given set of loop parameters the system is fully characterized by simulating its discrete impulse response $h_T[n]$, from which the transfer function $H_T(z)$:

$$H_T(z) = \frac{\phi(z)}{\theta(z)} \quad (9)$$

can be derived.

Choice of PLL Loop Parameters

Delay-locked loops (DLLs) have often been preferred over PLLs since they do not suffer from the effect of noise accumulation in the oscillator. On the other hand, PLLs have the advantage of filtering high-frequency jitter on the input clock. Additionally, an oscillator in the PLL is easier to design than a delay line since the shape of the clock signal does not change as the signal progresses along the delay line. By choosing the PLL loop parameters correctly, the noise properties of the adjustable PLL can be made very similar to a DLL.

The jitter sources in a PLL can be divided into three categories: First, jitter caused by random noise in the VCO, secondly, the phase deviation caused by variations of the supply, and thirdly, jitter on the input clock.

It is instructive to compare the various jitter components in the PLL to the case of an unregulated delay line of length $T_0 = 1/f_0$, which is also a first order representative for a delay-locked loop with small loop bandwidth. It is assumed that the delay line uses the same delay elements as in the VCO. Hence the effects of device noise and power supply jumps are the same in both cases.

For random noise sources, the standard deviation of jitter at the output of a delay line with a delay $T_0$ is given by:

$$\sigma_d = \kappa\sqrt{T_0} \quad (10)$$

where $\kappa$ is a figure of merit of the delay cell.

A sudden jump in supply voltage $V_{DD}$ leads to a jump in phase $\phi$ at the output of the delay line;

$$\Delta\phi = k_{VDD}\Delta V_{DD}, \quad (11)$$

where $\Delta V_{DD}$ is the jump in power supply voltage $V_{DD}$, and $k_{VDD}$ [rad/V] denotes the delay line gain with respect to the power supply node. Since there is no jitter accumulation in the delay line case, the phase jump $\Delta\phi$ is also the maximum phase deviation $\Delta\phi_{max,DLL}$. In a PLL, however, phase deviations are accumulated. A phase difference within one cycle $T_0$ is equivalent to a frequency jump of $\Delta f = (k_{VDD}\Delta V_{DD}/2\pi T_0)$ at the PLL input. The PLL reacts to the frequency jump $\Delta f$ and will eventually drive the phase deviation to zero. In the course of the adjustment, a maximum phase deviation $\Delta\phi_{max,PLL}$ will occur. By choosing the proper loop parameters, this resulting maximum phase deviation $\Delta\phi_{max,PLL}$ can be made comparable to the delay line case. Hence, by proper choice of the PLL loop parameters, jitter accumulation within the VCO can be made very similar to the case of the DLL. On the other hand, the PLL filters high-frequency noise on the clock input, which are not achieved by a DLL.

It is also interesting to compare the effect of using an XOR phase detector, effectively working at twice the sampling rate, to a single-edge triggered phase frequency detector (PFD). An XOR phase detector provides better input noise suppression since the averaging of two phase updates filters out much of the high frequency noise. The PFD, on the other hand, throws away the information from every second phase update. In the simulations, the random jitter values at the clock input were assumed to be statistically independent. This is a valid assumption for the case that the reference frequency, stemming from an LC-tank, contains little jitter, and hence the dominant jitter source at the clock input is the white noise accumulated in the clock distribution path.

Multi-Phase Phase Detector

In an embodiment of the architecture always two XOR phase detector outputs are combined in order to achieve lock to a phase position between two clock phases. In FIG. 5 two output currents $I_1$ and $I_2$ of a system with N=4 slave XOR phase detectors are displayed, wherein the output currents $I_1$ and $I_2$ of the two slave phase detectors are given as:

$$I_1(\Delta\phi) = \frac{I_{cp}}{\pi} \cdot (\Delta\phi - \pi/2) \quad (15)$$

$$I_2(\Delta\phi) = \frac{I_{cp}}{\pi} \cdot (\Delta\phi - \pi/2 - 2\pi/N),$$

where $\Delta\phi=\theta-\phi$ is the difference between input phase $\theta$ and output phase $\phi$. Linearly combining the two currents $I_1$ and $I_2$ by a weighting factor $\alpha$ results in the total phase detector output current I:

$$I(\Delta\phi)=(1-\alpha)I_1+\alpha I_2 \quad (16)$$

which, by forcing equation (16) to zero to obey the lock condition, results in the phase characteristic:

$$\Delta\phi(\alpha)=\pi/2+\alpha\cdot 2\alpha/N \quad (17)$$

Hence, the phase $\phi$ depends linearly on weighting factor $\alpha$.

Although the phase relationship is perfectly linear for ideal XOR phase detectors and square-shaped clock signals, linearity degrades with any imperfections. The impairment depends on the number N of used slave phase detectors. If N>4, some duty cycle imperfections can be tolerated without any implication on linearity.

Circuit Implementation

Figure 6:
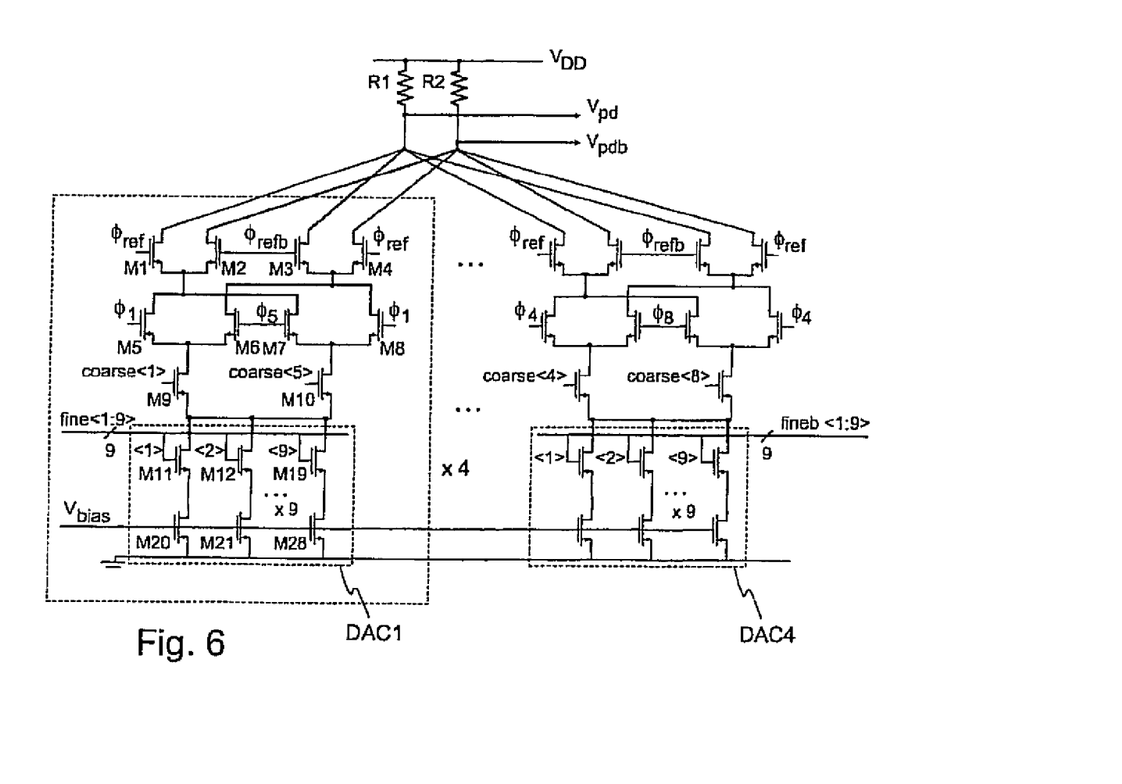

The implementation of the proposed multi-phase phase detector is depicted in FIG. 6. The phase detector is based on current mode logic (CML) style XOR cells. For example, in the slave phase detector depicted on the left side the reference clock signal $\phi_{ref}/\phi_{refb}$ is multiplied by the input clock phases $\phi_1$ and $\phi_{1b}=\phi_5$, where the transistors M1-M6 constitute a first Gilbert multiplier, and the transistors M1-M4, M7 and M8 constitute a second Gilbert multiplier. The reference clock $\phi_{refb}$ is the inverted reverence clock $\phi_{ref}$ and clock phase $\phi_{1b}$ is the inverted clock phase $\phi_1$.

The effective number of required XOR cells can be halved, as two opposite phase octants, e.g. $\phi_1$ and $\phi_5$, are never active at the same time and therefore can be combined. Hence, only four XOR cells are needed for an 8-phase phase detector. The reference clock $\phi_{ref}/\phi_{refb}$ is fed to all four XOR blocks, whereas the VCO phases $\phi_1$ to $\phi_8$ are distributed among the different sub-phase detectors. The transistors M9 and M10 act as switches and are used to select two phase octants. They are controlled by the control signals coarse<1> and coarse<5>.

It is to note that the power consumption in the phase detector shown in FIG. 6 is not increased when compared to a simple XOR-phase detector, because the sum of the currents flowing in the two interpolating branches is always constant.

The transistors M11 to M19 and M20 to M28 constitute a first current-digital-analog converter DAC1 to convert the digital value fine<1:9> in an analog current which represents one of the weighting factors $\alpha$. A fourth digital-analog converter DAC4 is shown in FIG. 6 on the ride side. The digital-analog converters DAC1 to DAC4 use 8 thermometer-coded bits plus one half-weight bit, thus providing 17 interpolation steps between any two phase octants chosen, resulting in a total of 136 phase steps for full 360° coverage. This corresponds to 34 phase steps per data unit interval for a quarter rate receiver, or about 3 ps per step at 10 Gb/s.

All transistors except the current sources M20-M28 in the phase detector use low threshold voltage devices in order to allow small supply voltages. The gate voltage of the current sources Vbias is generated by a bias generator (not shown), which regulates the common mode voltage at the output of the phase detector to ⅔ of the supply voltage $V_{DD}$.

Figure 9:
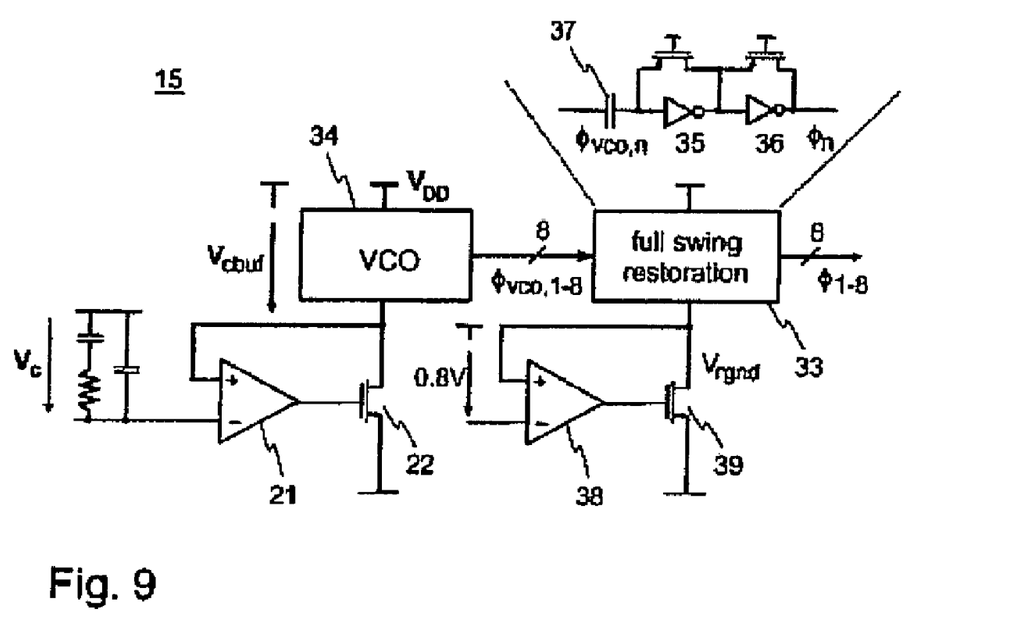

A block diagram of the VCO block 15 is displayed in FIG. 9. The control voltage Vc at the output of the loop filter 20 is buffered by a single stage operational amplifier 21, which regulates the gate voltage of an NMOS current source 22. The current source 22 creates a regulated ground node, which also serves as the control voltage node of the core VCO 34. By regulating the ground instead of the supply voltage $V_{DD}$, the current source 22 can be implemented using a small NMOS transistor. This minimizes the associated gate-drain capacitance, which limits the effect of power supply noise. The dominant pole of the operational amplifier 21 is at the gate node of the current source transistor 22. The second pole in the operational amplifier 21 appears at the drain of the VCO current source 22. Since this is a low impedance node and the VCO 34 does not contain any decoupling capacitance a sufficiently large phase margin can be achieved.

The signal swing at the output of the core VCO 34 depends on process and temperature variations. In consequence, a full swing restoration stage 33 can be added, which provides a large voltage swing at the output independent of the signal swing in the core VCO 34.

The full swing restoration stage 33 can be implemented as a pair of self-biased inverters 35 and 36, which are coupled to the core VCO 34 with a coupling capacitance 37. This capacitance 37 can be implemented as a MOSFET gate capacitance, which requires only very small area. In this case one can make use of one of the advantages of the Silicon-on-Insulator (SOI) technology. Since the capacitance 37 is not connected to a substrate, as in the case of a bulk technology, its associated parasitic capacitance is very small. Hence, with the SOI technology, the implementation of floating capacitances consume very small area and offer small coupling to power supply noise. An operational amplifier 38 controls the gate voltage of a current source transistor 39, such that the voltage on the drain connection of transistor 39, measured with respect to $V_{DD}$, is kept constant. This creates a regulated ground node $V_{rgnd}$ for the full-swing restoration stage 33, which provides high immunity to noise on the supply voltage.

Figure 10:
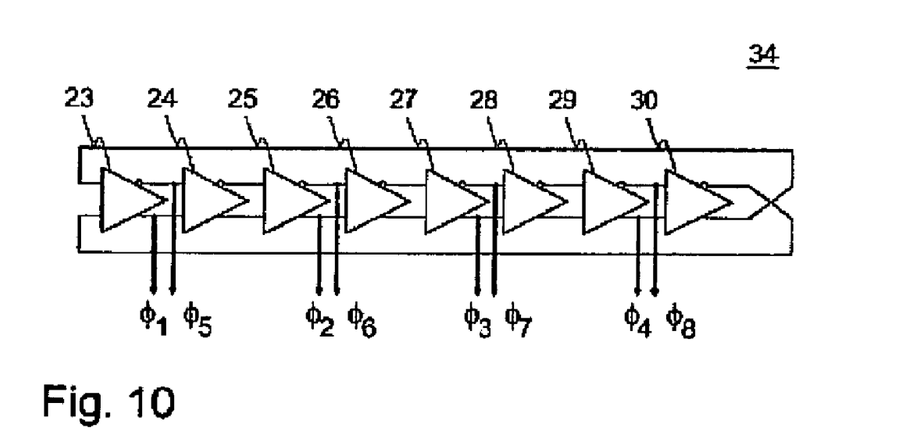

An embodiment of the core VCO 34 is displayed in FIG. 10 and comprises 8 delay stages 23 to 30, which are connected in series and based on CMOS inverters. The outputs of each second inverter provide two clock signals with the phases $\phi_1$ and $\phi_5$, $\phi_2$ and $\phi_6$, $\phi_3$ and $\phi_7$ and finally $\phi_4$ and $\phi_8$.

Figure 11:
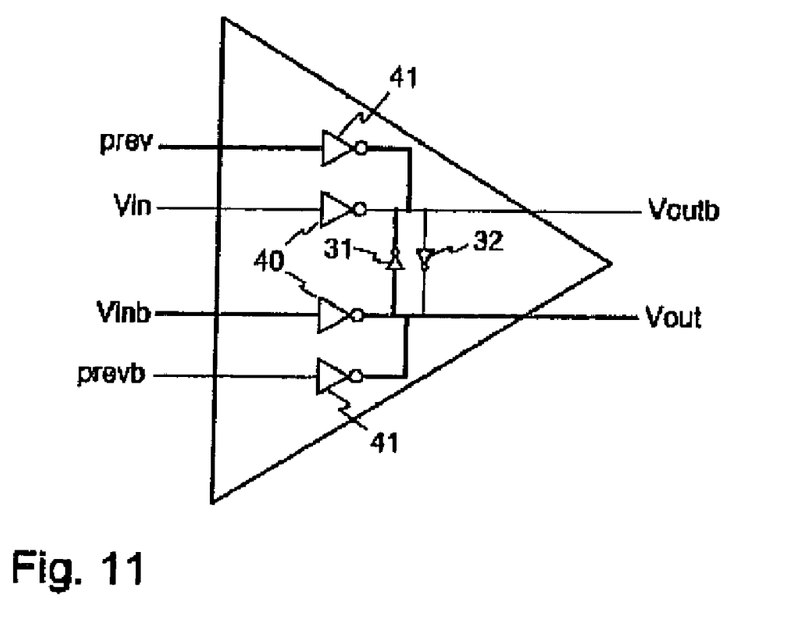

In FIG. 11 a single VCO delay stage of the delay stages 23 to 30 is depicted. The inputs Vin and Vinb of delay stage n are connected to the outputs of the previous delay stage n−1, while the inputs prev and prevb are connected to the outputs of delay-cell or delay stage n−2. The inputs Vin and Vinb go into an inverter 40, and the inputs prev and prevb into an inverter 41, where at the output nodes the signals are blended. Thus, since the input signals prev and prevb change before Vin and Vinb, a speedup path is provided. Two small cross coupling inverters 31 and 32 are added to achieve pseudo-differential clock phases and to assure stable oscillation. Although a total number of 16 phases with 25 ps spacing are generated, only every second output is effectively used. It is to note that the same VCO can also readily be used in a 20 Gbit/s system.

An adjustable PLL circuit was fabricated in a 90 nm partially depleted digital CMOS SOI technology. A version of the circuit also contains a shift register to provide digital control values to the adjustable PLL, and two inverter-based output buffers to monitor two opposite phase signals ($\phi_1$ and $\phi_5$).

To avoid a lock-in the circuit can include an auxiliary phase-frequency detector for lock acquisition. It is to note that this PFD for lock-in can be easily designed from standard digital library cells since it needs not be optimized for low-jitter performance.

Figure 12:
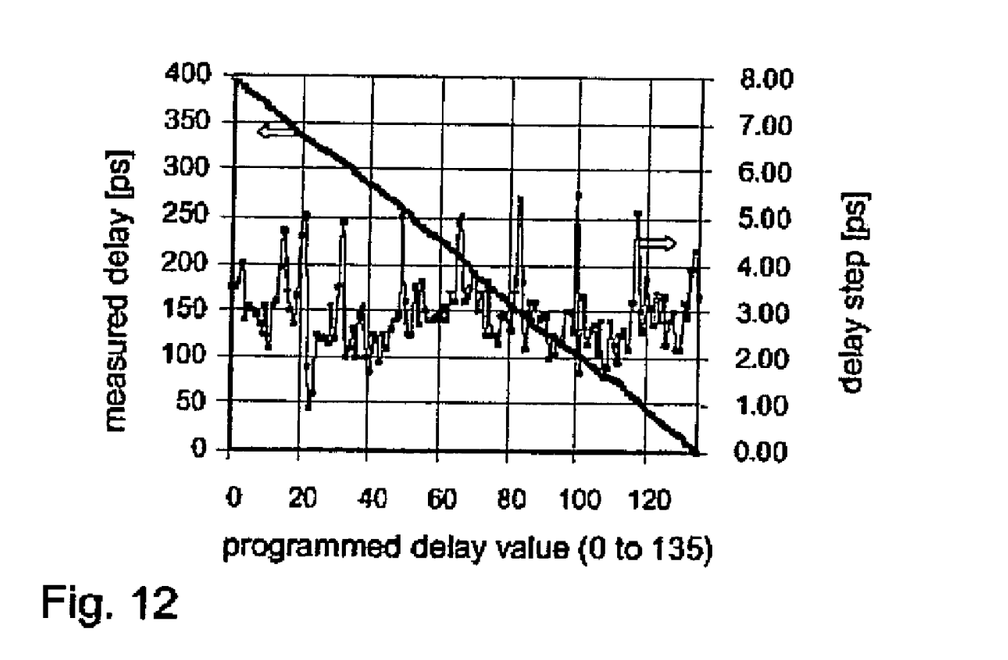

The measured delay characteristic is displayed in FIG. 12. The value on the x-axis corresponds to the programmed delay value, which ranges from zero to 135. The resulting phase delay corresponds to the left axis, while the delay step values are displayed on the right axis. The measured delay curve is monotonia, with a maximum deviation of +2.1/−2.5 ps from the nominal value of 400 ps/136=2.95 ps.

Having illustrated and described a preferred embodiment for a novel method and apparatus for, it is noted that variations and modifications in the method and the apparatus can be made without departing from the spirit of the invention or the scope of the appended claims.

REFERENCE SIGNS 1 transmitter
2 data channel
3 receiver
4 phase detector
5 loop filter
6 voltage controlled oscillator
7 phase rotator
8 phase generator
9, 50 sampling latches
10 loop filter
11 digital delay locked loop
12 phase locked loop
13 adjustable phase locked loop
14 digital delay locked loop
15 voltage controlled oscillator block
16.1-16.8 slave phase detectors 1 to 8
17.1-17.8 weighting units 1 to 8
18 summation element
19 voltage-current converter
20 loop filter
21 operational amplifier
22 current source transistor
23-30 delay stages
31 cross coupling inverter
32 cross coupling inverter
33 full swing restoration unit
34 core VCO
35 inverter
36 inverter
37 coupling capacitance
38 operational amplifier
39 transistor
40 inverter
41 inverter
$\phi_1$-$\phi_n$ phases 1 to n
$\phi_{ref}$ phase of reference clock
$\phi_{refb}$ phase of the inverse reference clock
D1-D4 data bits 1 to 4
M over-sampling rate
N number of slave phase detectors
R1, R2 resistors 1 and 2
M1-M28 transistors 1 to 28
$V_{DD}$ voltage
Vpd weighted output voltage
Vpdb inverse weighted output voltage
ctrl control signal
Cp ripple capacitance
Cl capacitance
R loop filter resistance
DAC1-DAC4 digital-analog converter 1 to 4

What is claimed is:

1. A phase locked loop with adjustable phase shift, comprising:
a voltage controlled oscillator configured to generate multiple phase shifted output signals;
multiple phase detectors configured to determine phase differences between the phase shifted output signals and a reference clock; and
a weighting device configured to weight the phase differences and generate a control signal, which is based on the weighted phase differences, for the voltage controlled oscillator, wherein a weighting factor, by which the weighting is performed, is dynamically dependent on phase deviations with an input data signal received by a receiver and wherein the weighting effectuates alignment of the multiple phase shifted output signals with the phase of the input data signal.

2. The phase locked loop according to claim 1, wherein the multiple phase detectors are formed by one or more of XOR-gates or by Gilbert multipliers.

3. The phase locked loop according to claim 1, where two of the multiple phase detectors which are not simultaneously active have common multiplier elements.

4. The phase locked loop according to claim 1, wherein the voltage controlled oscillator comprises a multi stage delay line to generate the phase shifted output signals.

5. The phase locked loop according to claim 1, wherein a voltage-to-current converter and loop filter are coupled between the weighting device and the voltage controlled oscillator.

6. The phase locked loop according to claim 1, wherein the weighting device comprises multiple digital-analog converters to receive a digital control value and generating therefrom analog weighting factors for weighting the phase differences.

7. The phase locked loop according to claim 6, wherein the digital-analog converters are binary and thermometer encoded.

8. The phase locked loop according to claim 6, comprising a switching unit to connect one of the two phase detectors which have common multiplier elements to one of the digital-analog converters.

9. The phase locked loop of claim 1, wherein the reference clock is not based on the input data signal.

10. A clock and data recovery system, comprising:
a phase locked loop including:
a voltage controlled oscillator configured to generate multiple phase shifted output signals;
multiple phase detectors configured to determine the phase differences between the phase shifted output signals and a reference clock;
a weighting device configured to weight the phase differences and generate a control signal, which is based on the weighted phase differences, for the voltage controlled oscillator, wherein a weighting factor, by which the weighting is performed, is dynamically dependent on phase deviations with an input data signal received by a receiver and wherein the weighting effectuates alignment of the multiple phase shifted output signals with the phase of the input data signal; and wherein multiple sampling latches capable of intermediately storing received data are connected to the voltage controlled oscillator.

11. The clock and data recovery system of claim 10, wherein the reference clock is not based on the input data signal.

12. A receiver of a serial data link, comprising:
a phase locked loop including:
 a voltage controlled oscillator configured to generate multiple phase shifted output signals;
 multiple phase detectors configured to determine the phase differences between the phase shifted output signals and a reference clock; and
 a weighting device configured to weight the phase differences and generate a control signal, which is based on the weighted phase differences, for the voltage controlled oscillator, wherein a weighting factor, by which the weighting is performed, is dynamically dependent on phase deviations with an input data signal received by a receiver and wherein the weighting effectuates alignment of the multiple phase shifted output signals with the phase of an input data signal.

13. The receiver of claim 10, wherein the reference clock is not based on the input data signal.

* * * * *